United States Patent [19]

Chiba et al.

[11] Patent Number: 4,525,809
[45] Date of Patent: Jun. 25, 1985

[54] INTEGRATED CIRCUIT

[75] Inventors: Fumitaka Chiba; Kyozo Shimizu, both of Tokyo, Japan

[73] Assignee: Nippon Electric Co., Ltd., Tokyo, Japan

[21] Appl. No.: 644,664

[22] Filed: Aug. 27, 1984

Related U.S. Application Data

[63] Continuation of Ser. No. 342,935, Jan. 26, 1982.

[30] Foreign Application Priority Data

Jan. 26, 1981 [JP]  Japan ................................. 56/9992

[51] Int. Cl.³ ............................................ G11C 11/40
[52] U.S. Cl. ...................................... 365/51; 365/63; 365/72
[58] Field of Search ....................... 365/51, 63, 72, 200

[56] References Cited

U.S. PATENT DOCUMENTS

| | | | |
|---|---|---|---|
| 3,365,707 | 1/1968 | Mayhew | 365/72 |
| 3,643,232 | 2/1972 | Kilby | 365/72 |
| 3,839,846 | 8/1974 | Berg et al. | 365/72 |
| 3,936,812 | 2/1976 | Cox et al. | 340/173 R |
| 4,233,672 | 11/1980 | Suzuki et al. | 365/181 |
| 4,402,044 | 8/1983 | McDonough et al. | 357/45 |

OTHER PUBLICATIONS

Cook et al., "Memory System Fabrication Using Laser Formed Connections", *IBM Tech. Disc. Bul.*, vol. 17, No. 1, 6/74, pp. 245–247.

*Primary Examiner*—Terrell W. Fears
*Attorney, Agent, or Firm*—Laff, Whitesel, Conte & Saret

[57] ABSTRACT

A semiconductor integrated circuit having improved information processing function is disclosed. The integrated circuit comprises a semiconductor substrate, an information processing circuit fabricated on the substrate, a plurality of unit cells each having at least one transistor, a first discretionary wiring for connecting between transistors of the unit cells and a second discretionary wiring for connecting between the information processing circuit and some of the unit cells.

4 Claims, 19 Drawing Figures

INTEGRATED CIRCUIT

This is a continuation of application Ser. No. 342,935, filed Jan. 26, 1982.

The present invention relates to an integrated circuit, and more particularly to a monolithic integrated circuit having information processing function.

In recent years, owing to progress in the semiconductor integrated circuit technology, a semiconductor integrated circuit provided with a processing section, a random access memory (RAM) section and a read only memory (ROM) section and having information processing function, that is, the so-called microcomputer has been developed and made commercially available. In this microcomputer, predetermined information processing is executed under instructions by a program stored in a ROM. However, in such type of microcomputers, since the functions of peripheral circuits such as, for example, input/output circuits, logic gates in input/output sections, etc. were fixed, the functions which can be executed in the microcomputers were limited. Therefore, it was compelled in the prior art either to manufacture microcomputers having their peripheral circuit constructions differently designed for respective different applications or to expand the function of the peripheral circuit by making use of a large number of standard logic integrated circuits. According to the former approach, however, microcomputers must be designed individually for each different application, hence a period for design is prolonged, and moreover, a manufacturing cost is also greatly increased due to large-variety small-number production. Thus it is not practical. According to the latter approach, due to the use of a large number of standard logic integrated circuits, a packaged volume of a device is increased and hence reduction in size of devices is prevented.

It is therefore one object of the present invention to provide an integrated circuit which can easily realize any arbitrary variety of information processing functions.

Another object of the present invention is to provide an integrated circuit which can achieve expansion of a function at low cost.

Still another object of the present invention is to provide a method for manufacturing at a high density and at low cost an integrated circuit including a computer function block and its peripheral circuit.

According to the present invention, a processing section (CPU), a RAM section, a ROM section and a plurality of basic logic cells are provided on the same semiconductor substrate, and wirings relating to the basic logic cells are effected in an arbitrary pattern so as to realize a desired information processing function. In other words, according to the present invention, at least a part of a peripheral circuit is formed of basic logic cells. Here, it is to be noted that the above-referred basic logic cell could be a basic circuit such as an inverter or a logic gate circuit such as a NOR-circuit, a NAND-circuit, an AND-circuit, etc. Otherwise, it could be formed of only a number of transistors.

Also according to the present invention, upon manufacturing the above-proposed integrated circuit, it is preferable that a wiring pattern relating to a CPU section and a RAM section is depicted on a photo-resist through an optical exposure process employing a photomask with a fixed pattern, while a wiring pattern relating to basic logic cells is depicted on the same photo-resist through a direct exposure process of an electron beam. And after completion of both the aforementioned optical exposure and electron beam exposure, then, the photo-resist is developed and wirings are formed by the developed resist pattern. Thereby integrated circuits granted with any arbitrary function can be realized substantially without enlarging a patterning step.

According to one feature of the present invention, there is provided a semiconductor integrated circuit, in which on a part of an integrated circuit chip is disposed at least one computer function block including a central processing unit (CPU), a ROM, a RAM, and a peripheral circuit, etc. in which at least a part of the peripheral circuit is composed of basic logic cells and different information processing functions can be realized in one chip by providing basic logic cells with optional wiring pattern.

The above-mentioned and other features and objects of the present invention will become more apparent by reference to the following description of preferred embodiments of the invention taken in conjunction with the accompanying drawings, wherein:

Now the present invention will be described in greater detail with reference to the accompanying drawings. At first, a basic structure of an integrated circuit according to the present invention will be described with reference to FIG. 1. On a semiconductor chip 1 are provided a basic logic unit cell array 2 and a computer function block 3. The computer function block 3 is comprised of a system controller 4, a ROM (Read Only Memory) 5, a peripheral input/output circuit 6, an ALU (Arithmetic Logic Unit) 7, a RAM (Random Access Memory) 8 and three bus lines 9, 10 and 11. In this basic structure, by providing metallic wirings for the logic cells in the logic unit cell array 2 in any arbitrary pattern it is possible to construct an additional interface circuit with the logic unit cells or to expand a function of the peripheral circuit 6 or the computer function block 3. Thus, different function can be realized on one chip. It is to be noted that in the computer function block 3, only the ROM 5 has a programmable function that is programmed for example, by changing metallic wirings, but other sections have fixed wiring patterns which are not modified. However it is possible to make interconnections between the computer function block 3 and the logic unit cells in the array 2. If the ROM 5 in the computer function block 3 is a mask-programmable ROM of the type that memory information is stored during a manufacturing process of a semiconductor device, it can be produced simultaneously with the above-described metallic wiring process for the logic unit cells.

Figure 1:
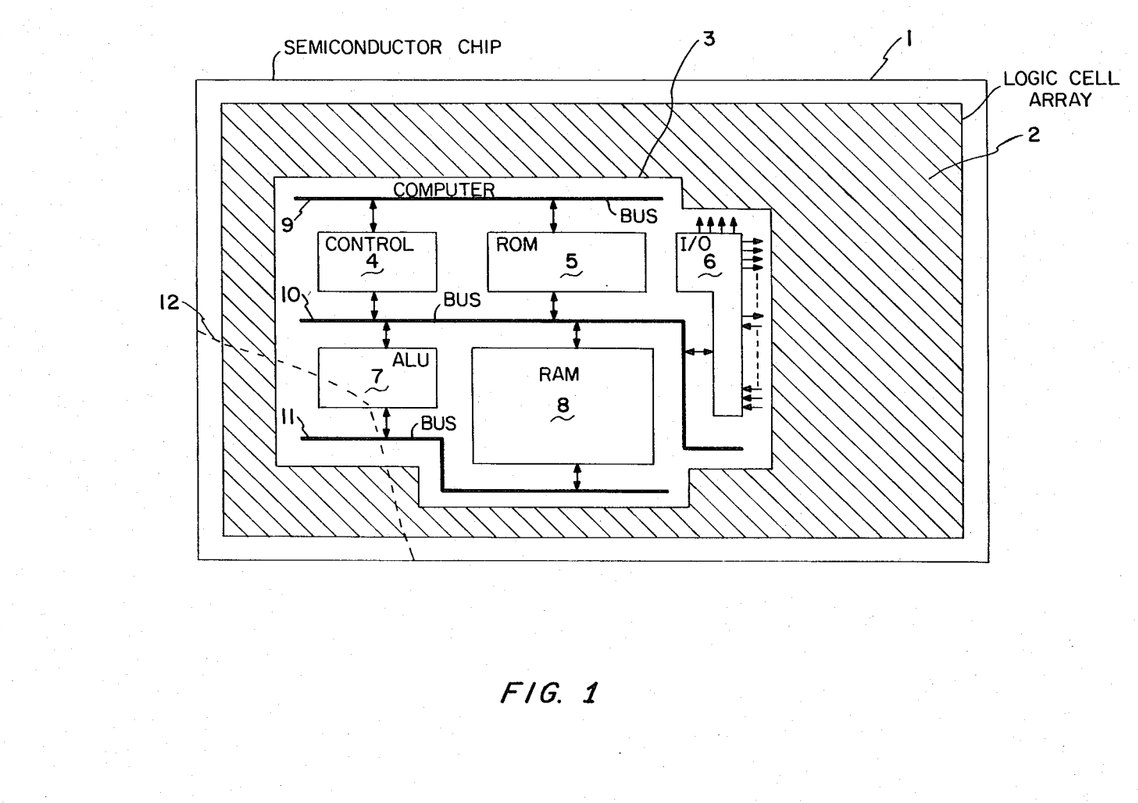
FIG. 1 is a plan view showing an integrated circuit according to one preferred embodiment of the present invention.
Figure 2:
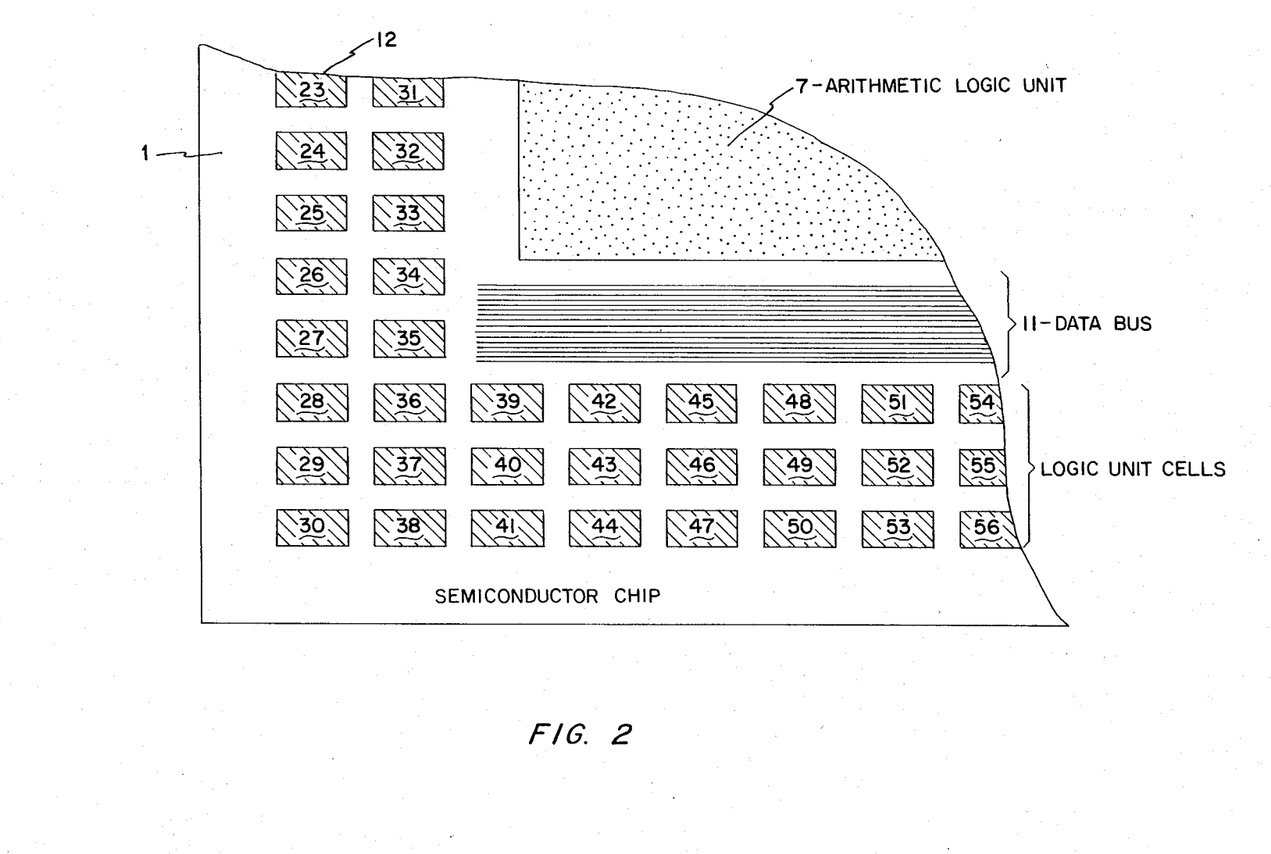
FIG. 2 is a plan view showing a part of the integrated circuit in FIG. 1 in an enlarged scale.

FIG. 2 shows a part 12 of the chip 1 in FIG. 1 in an enlarged scale, and in this figure is illustrated an arrangement of data bus lines 11 and unit cells 23 to 56 in the unit cell array 2. These logic unit cells can be connected to the data bus lines 11 and the ALU 7 through metallic wirings (not shown). Also, interconnection can be made between any adjacent logic unit cells via metallic wirings (for example, between the logic unit cells 23 and 24, between the cells 23 and 31, . . . ). In this way, it is possible to form a desired or an additional peripheral circuit by use of the logic unit cells with optional wirings or to form a further enhanced expanded interface circuit by connecting the logic unit cells to the data bus lines 11.

Figure 3:
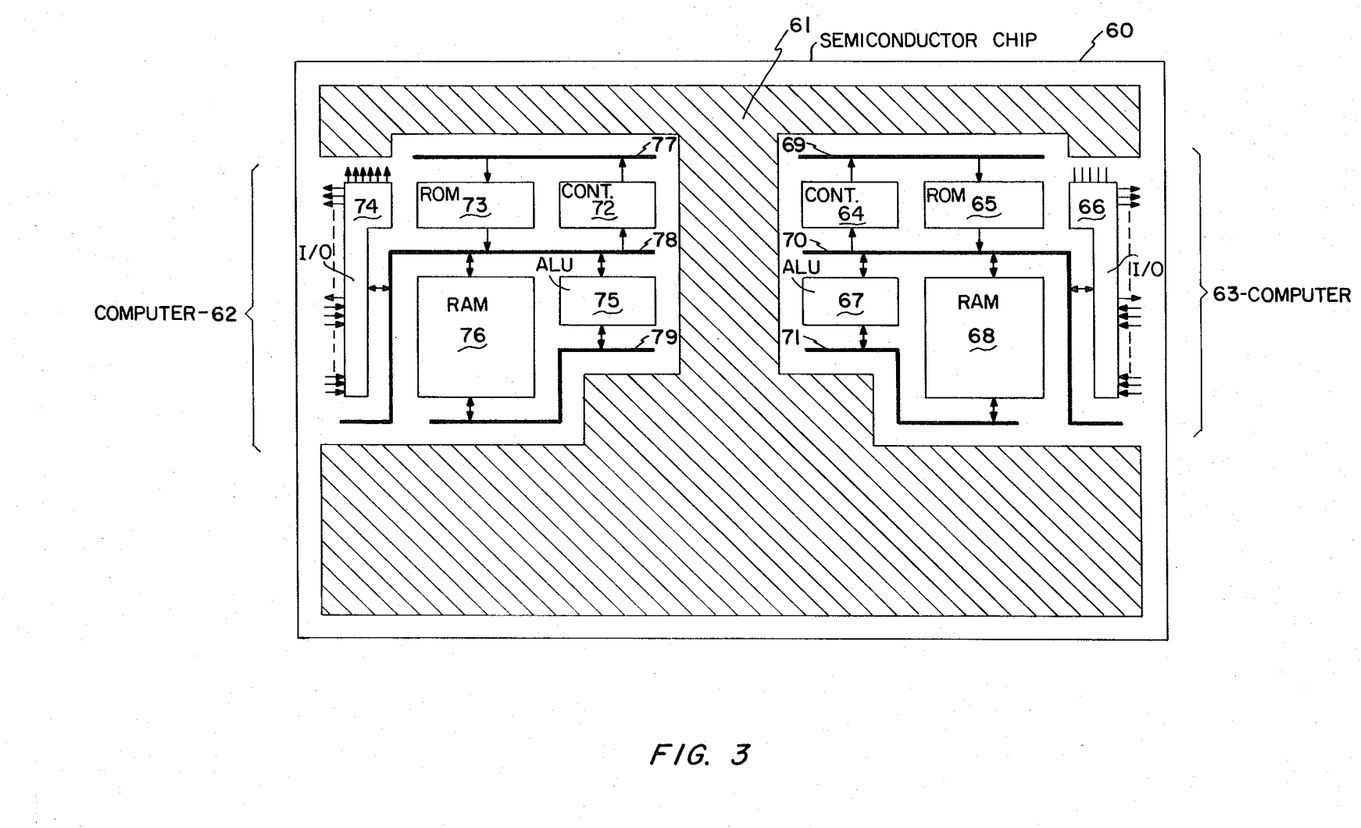
FIG. 3 is a plan view showing an integrated circuit according to another preferred embodiment of the present invention.

FIG. 3 shows another basic structure of an integrated circuit chip according to the present invention, in which two computer function blocks 62 and 63 are disposed on a left side and a right side of a semiconductor chip 60, respectively. More particularly, the computer function block 62 disposed on the left side of an integrated circuit chip 60 comprises a system controller 72, a ROM 73, an ALU 75, a RAM 76, a peripheral input/output circuit 74 and bus lines 77 to 79. The other computer function block 63 is disposed on the right side of the integrated circuit chip 60 and comprises a system controller 64, a ROM 65, an ALU 67, a RAM 68, a peripheral input/output circuit 66 and bus lines 69 to 71. In this illustrated integrated circuit chip 60, an array 61 of logic unit cells is disposed mainly in the hatched area between the two computer function blocks 62 and 63. In this example, the logic unit cells in the array 61 are similarly arranged to FIG. 2 and are selectively provided with optional pattern of wiring associated to the block 62 and/or the block 63 so as to provide them with a desired or enhanced logic function. In this structure, two computer function blocks having substantially the same structure are disposed in one integrated circuit chip. Hence, a two-processor computer of decentratized processing type can be formed in one chip by modifying the codes in the respective ROM's and further combining the logic unit cells. While the same computer function blocks were disposed in the integrated circuit chip shown in FIG. 3, as a matter of course it is possible to dispose different computer function blocks on one semiconductor chip depending upon the objects.

The advantage obtained as a result of this invention are as follows:

(1) By integrating a computer function block and any arbitrary logic circuits in its periphery in one chip, reduction in size of a device can be achieved.

(2) Wiring adapted for a desired function can be effected in a simple manner, and hence a period for development can be widely shortened.

(3) By producing a peripheral function with arbitrary wiring, a number of component parts can be reduced and a manufacturing process as well as an inspection process can be simplified.

(4) Since integrated circuits having a variety of functions can be realized by making use of semiconductor substrates of the same structure, the integrated circuits are suitable for the purpose of large-variety small-amount LSI production.

(5) By utilizing the logic unit cells also for enhancing a computer function, it is possible to make an integrated circuit have an expansibility in function.

(6) Since sole-use LSI's having different functions can be produced by merely modifying metallic wirings, it is possible to reduce errors in mask design or in logic design.

Detailed embodiments of the present invention will be described in the below.

Figure 4:
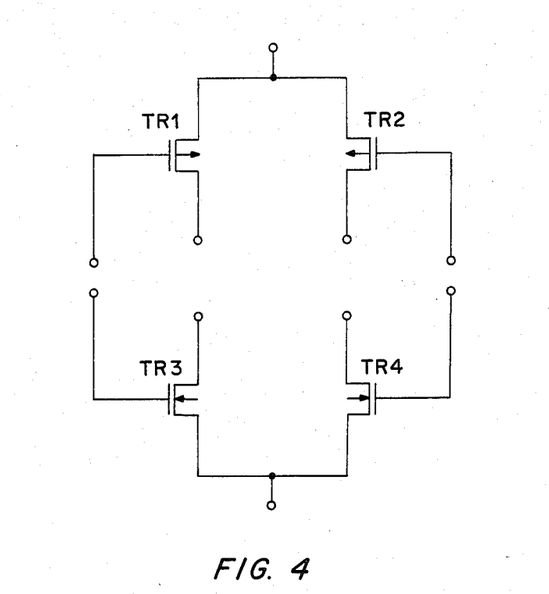
FIG. 4 is a circuit diagram showing a circuit arrangement in a logic cell which can be effectively utilized in the integrated circuit according to the present invention.

FIG. 4 shows one example of a circuit available in the logic unit cells 23 to 56 in FIG. 2, which circuit makes use of four transistors TR1 to TR4. This logic cell consists of two P-channel MIS transistors TR1 and TR2 having commonly coupled drains and two N-channel MIS transistors TR3 and TR4 having commonly coupled sources.

Figure 5:
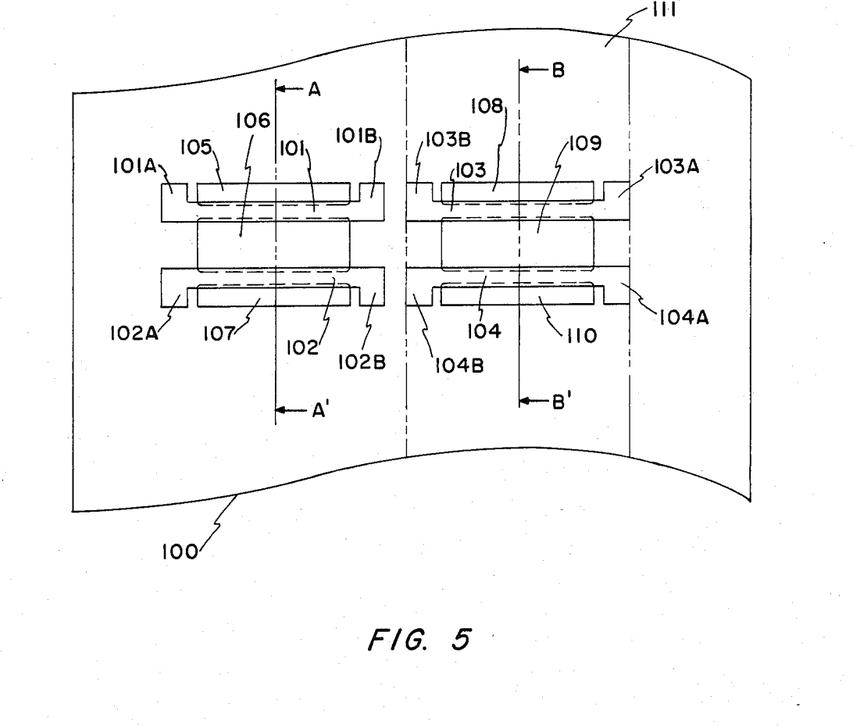
FIG. 5 is a plan view showing a cell structure having the circuit arrangement in FIG. 4.

A semiconductor structure of the unit cell shown in FIG. 4 will be described by FIG. 5. In FIG. 5, a gate electrode wiring 101 for the transistor TR1 is made of, for example, polycrystalline silicon (polysilicon) and gate terminal lead-out portions 101A and 101B are drawn therefrom. A gate electrode wiring layer 102 for the transistor TR2 made of polycrystalline silicon has gate terminal leadout portions 102A and 102B. A gate electrode wiring 103 for the transistor TR3 provided with gate terminal lead-out portions 103A and 103B thereof, and a gate electrode wiring 104 for the transistor TR4 provided with gate terminal lead-out portions thereof 104A and 104B are similarly made of polycrystalline silicon. P+-type regions 105, 106 and 107 form the source and drain regions of the P-channel type transistors TR1 and TR2. Likewise N+-type regions 108, 109 and 110 form the source and drain regions of the N-channel type transistors TR3 and TR4. It is to be noted that an island-shaped P-type region (P-well) 111 is formed in an N-type silicon semiconductor substrate 100, and in this P-type region are formed the N-channel type transistors TR3 and TR4. In this instance, the aforementioned source regions and drain regions can be formed through the conventional impurity doping process such as, for example, an ion implantation process, a solid-to-solid diffusion process from impurity-containing glass, or the like. Upon formation of these source and drain regions, the impurity is simultaneously doped in the gate electrodes made of polycrystalline silicon to give them good electric conductivity.

Figure 6:
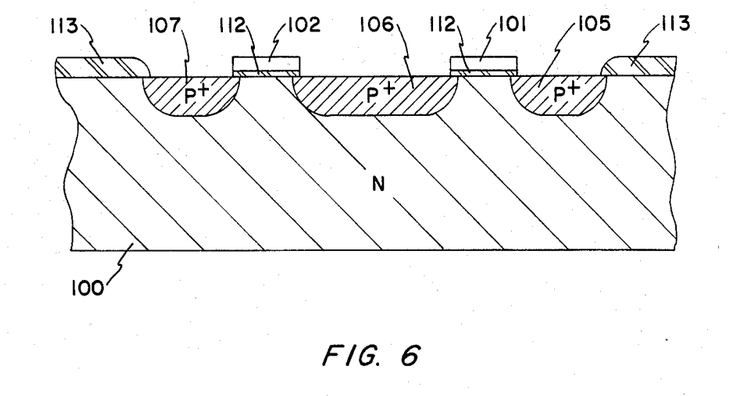
FIG. 6 is a cross-section view of the cell structure taken along line A—A' in FIG. 5.
Figure 7:
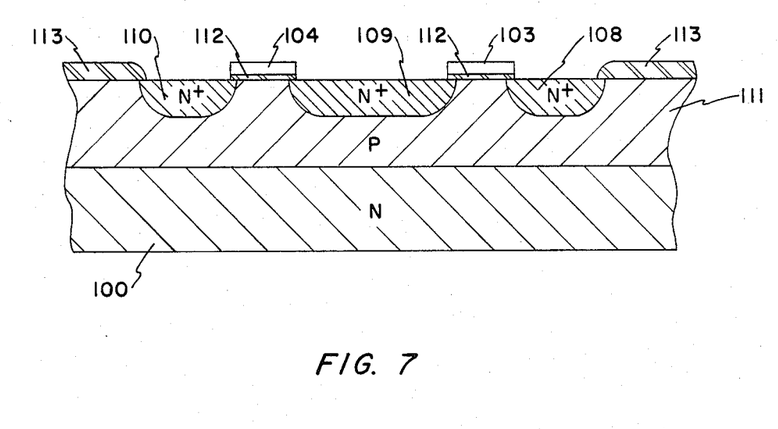
FIG. 7 is another cross-section view of the same cell structure taken along line B—B' in FIG. 5.

As described above, in the logic unit cell to be used in the integrated circuit according to the present invention, three P+-type regions and three N+-type regions are disposed symmetrically on the left and on the right, respectively, with the gate electrode terminal lead-out portions 101B and 103B, and 102B and 104B located at adjacent positions to each other, and two upper and lower gate electrodes are disposed in a symmetric manner so as to cover the area between the impurity-doped regions. Also, between the upper and lower gate electrodes is provided a gap space for allowing terminals to be led out from the impurity-doped regions 106 and 109. It is to be noted that a cross-section taken along line A-A' in FIG. 5 as viewed in the direction of arrows is illustrated in FIG. 6 and a cross-section taken along line B-B' in FIG. 5 as viewed in the direction of arrows is illustrated in FIG. 7. In FIGS. 6 and 7, reference numeral 112 designates a gate insulator film made of silicon dioxide ($SiO_2$), and reference numeral 113 designates a field insulator film that is also made of silicon dioxide.

Figure 8:
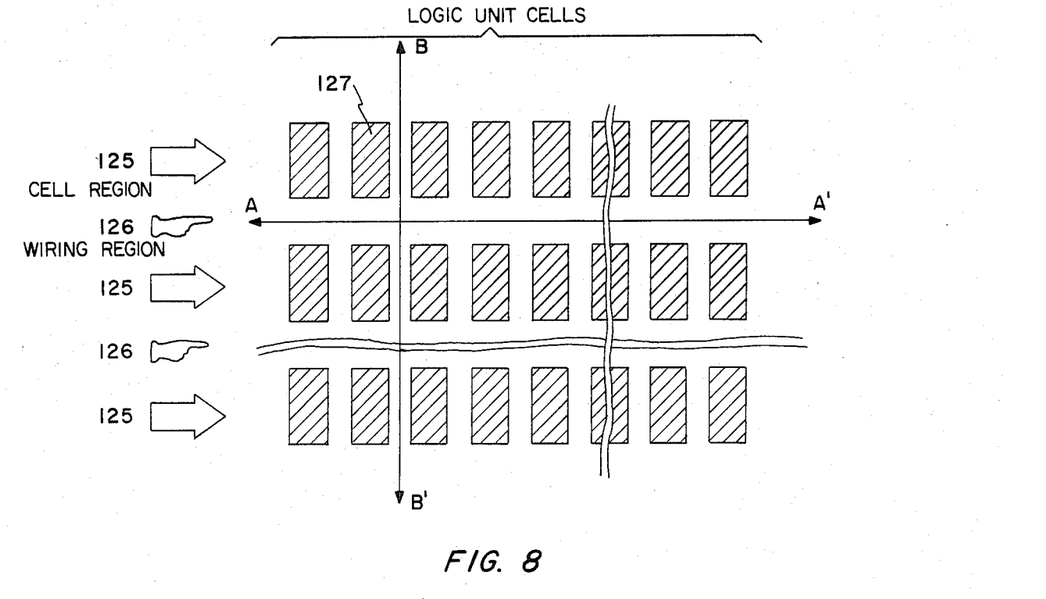
FIG. 8 is a plan view showing a layout of logic cells.

The above-described logic unit cells are arrayed on one semiconductor chip in a plurality of columns and rows, that is, in the form of the so-called "array". Assuming now that the logic unit cells are arrayed in a plurality of columns in a longitudinal direction (A-A'), then a wiring region in a lateral direction (B-B') is established for an individual logic unit cell in each column. FIG. 8 shows an array of logic unit cells on a semiconductor chip, in which in each column region 125 are disposed several tens to several hundreds of logic unit cells 127 as aligned in the longitudinal direction (A-A'), and in each of longitudinal wiring regions 126 provided between adjacent column regions 125 are disposed about 10 to 30 wirings. The column regions 125 are disposed in several tens of columns on a semiconductor chip according to requirement.

Figure 9:
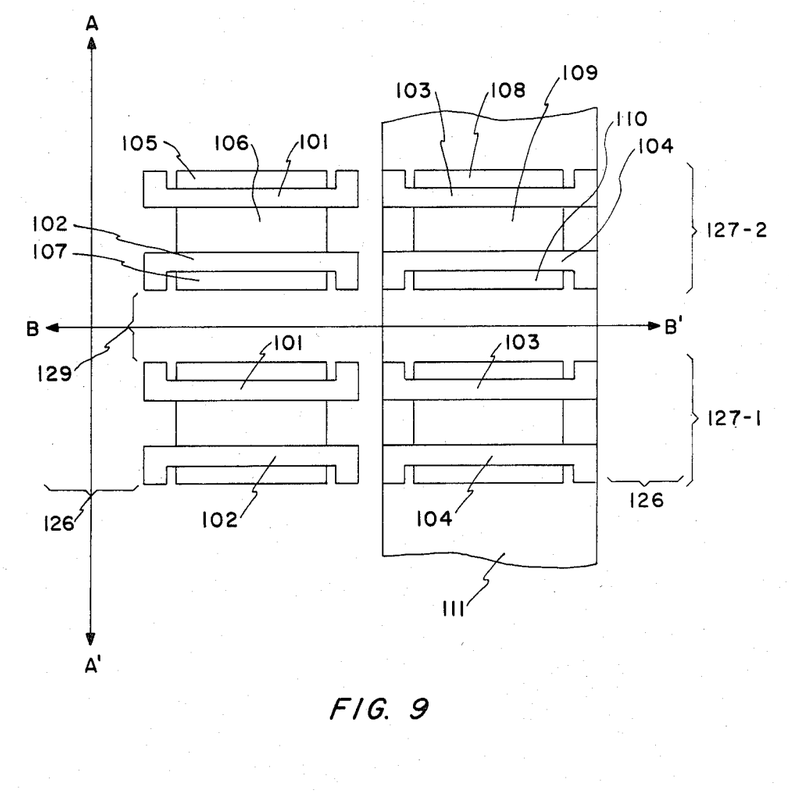
FIG. 9 is a schematic plan view to be used for explaining the directions for layout of logic cells.

FIG. 9 is a schematic view showing the arrayed state of the logic unit cells 127-1 and 127-2 in terms of the MIS transistors in FIG. 5. Between one logic unit cell 127-1 and an adjacent logic unit cell 127-2 is formed a lateral wiring vacant region 129 (in the direction of B-B'), and in this region is reserved a space for allowing about 1 to 4 wirings to be disposed therein. Owing to the fact that lateral (B-B' direction) wiring regions 129 are present between respective adjacent logic unit cells in the above-described manner, decentralization of lateral wirings can be achieved. In general, localized concentration of wirings would lower a wiring efficiency. Hence, it is important for improvement of a wiring efficiency to distribute wirings over the entire large scale integrated circuit.

In addition, since the gate electrode terminals of the logic unit cell 127 can be led out to the longitudinal (A-A' direction) wiring vacant regions 126 in a laterally symmetric manner as described previously, the wiring becomes very easy and a flexibility in wiring can be enhanced. This is because even in the event that a longitudinal wiring region 126 on one side becomes to be too densely occupied by wirings, the desired longitudinal wiring can be dealt with in the next adjacent longitudinal wiring region by making use of the terminals on the opposite side.

Upon realizing the above-mentioned longitudinal wirings and lateral wirings, as wiring layers a double-layer wiring structure consisting of a longitudinal wiring layer and a lateral wiring layer. Assuming now that the wiring layer on the side near to the semiconductor substrate, that is, the lower wiring layer is called "first layer" and the wiring layer on the side remote from the semiconductor substrate, that is, the upper wiring layer is called "second layer", then the first layer is parallel to the direction of arrowed line A-A' in FIGS. 8 and 9, that is, the longitudinal direction of the column of logic unit cells, while the second layer can be provided in the direction of arrowed line B-B' in FIGS. 8 and 9, that is, in the lateral direction at right angles to the first layer. The above-mentioned lower wiring layer is formed on a first insulator layer made of, for example, phosphorus silicate glass (PSG) covering the above-described polycrystalline silicon electrodes 101 to 104, and the upper wiring layer is formed on a similar insulator layer likewise made of phosphorus silicate glass which covers the lower wiring layer. Furthermore, another phosphorus silicate glass for passivation is formed covering the upper wiring layer.

Figure 10:
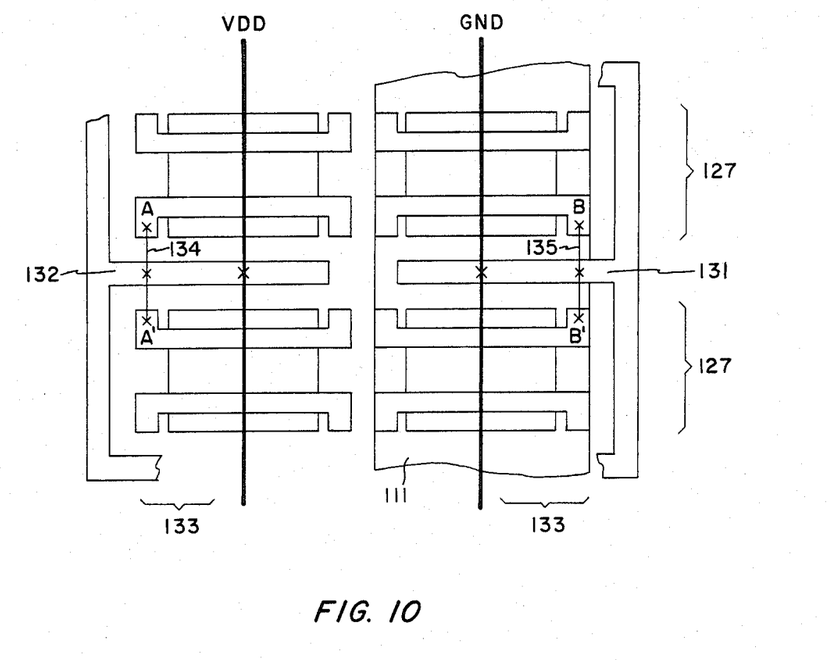
FIG. 10 is a schematic plan view showing power supply writings for logic cells.

The wiring in the aforementioned first layer is provided not only on the longitudinal wiring region 126 but also on the logic unit cell column region 125 (FIG. 8) as shown in FIG. 10. The wirings disposed on the logic unit cell column region 125 are allotted for power supply lines, and these power supply lines $V_{DD}$ and GND make ohmic contact at the points marked X with a P+-type region 131 provided on the island-shaped region 111 and an N+-type region 132 provided on the N-type silicon semiconductor substrate, respectively, in the lateral wiring region 129 between adjacent logic unit cells 127.

In a complementary MIS circuit, unused input gates are not allowed to be left disconnected from any point, and hence, they must be connected to either one of the power supply lines. In order to deal with such unused input terminals, use is made of the lateral wiring region 129 that is provided for each logic unit cell. With reference to FIG. 10, in the case where terminal lead-out portions A and B or A' and B' are unused terminals, these unused terminals can be easily connected to either one of the power supply lines $V_{DD}$ and GND by connecting the terminal lead-out portion A or A' to the N+-type region 132 as a wiring by making use of a wiring layer in the first layer and connecting the terminal lead-out portion B or B' to the P+-type region 131 as a wiring by making use of wirings 134 and 135 in the first layer.

The above-described connections of unused terminals can be realized through wirings 134 and 135 by making use of a wiring 133 region in the first layer placed between the wirings provided in the longitudinal wiring region 126 and the power supply lines ($V_{DD}$, GND), hence the connection of the unused terminals can be achieved independently of the lateral wiring layer in the second layer, and therefore, wiring regions on a semiconductor chip can be utilized very effectively.

According to the present invention, by appropriately wiring between the basic elements in the above-described logic unit cell, several tens varieties of logic gates, flip-flops, etc. can be formed.

Figure 11:
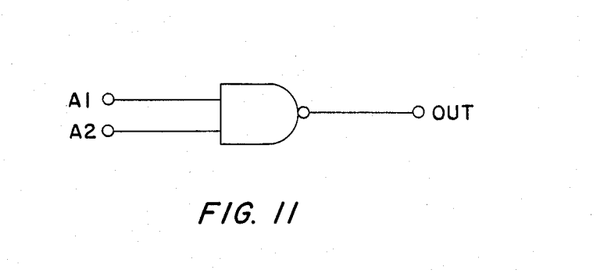
FIG. 11 is a logic symbol representing a NAND-circuit.
Figure 12:
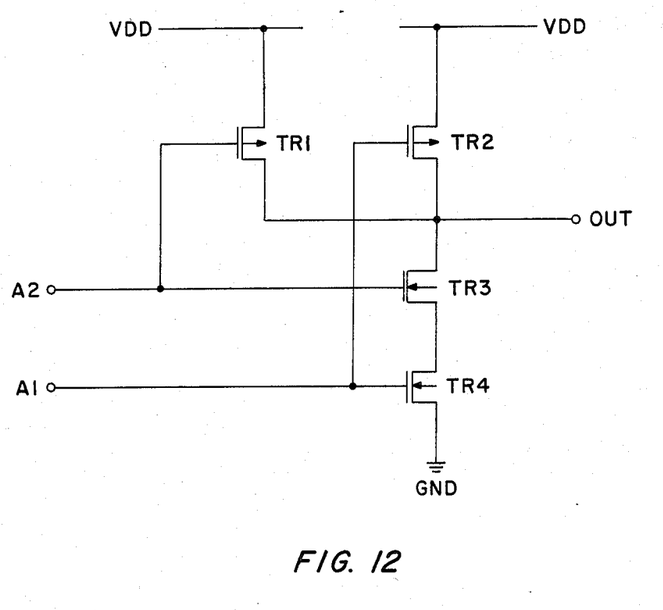
FIG. 12 is a circuit diagram showing a NAND-circuit constructed by making use of the cell shown in FIG. 4.
Figure 13:
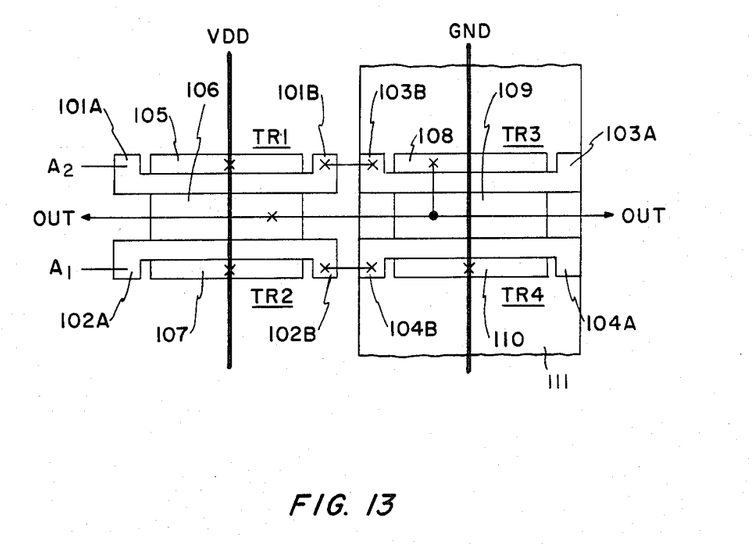
FIG. 13 is a plan view showing a cell structure in which the circuit arrangement shown in FIG. 12 is realized.

Now description will be made on one example of formation of a NAND-circuit by making use of logic unit cells according to the present invention. A logic symbol representing a NAND-circuit is shown in FIG. 11, and a circuit diagram of a NAND-circuit consisting of complementary MIS transistors TR1 to TR4 is shown in FIG. 12. A layout diagram of such a NAND-circuit constructed of logic unit calls according to the present invention is illustrated in FIG. 13. In FIG. 13, thick solid lines represent wirings in the first layer, while thin solid lines represent wirings in the second layer. Marks X represent the points where the corresponding wirings make ohmic contact with impurity doped regions in the semiconductor substrate through contact holes in the insulator layer or layers, while a mark represents a junction point between a first layer wiring and a second layer wiring. The connection at this junction point is effected via a through-hole provided in the inter-layer insulator layer made of, for example, phosphorus silicate glass (PSG). Here, that is to be noted that in the NAND-circuit constructed of the logic unit cells according to the present invention, owing to the space provided between the two electrodes 101 and 103 and the other two electrodes 102 and 104, it is possible to led out the output wiring of the NAND-circuit to the longitudinal wiring regions on the both sides of the logic unit cell.

Figure 14:
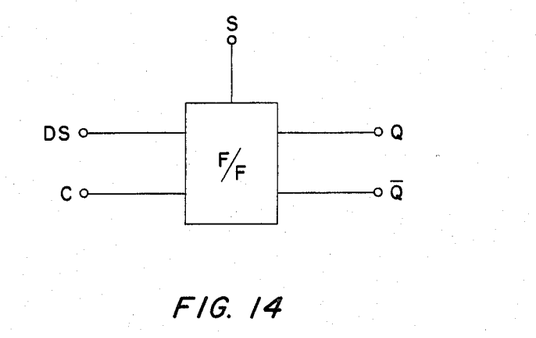
FIG. 14 is a logic symbol representing a D-type flip-flop.
Figure 15:
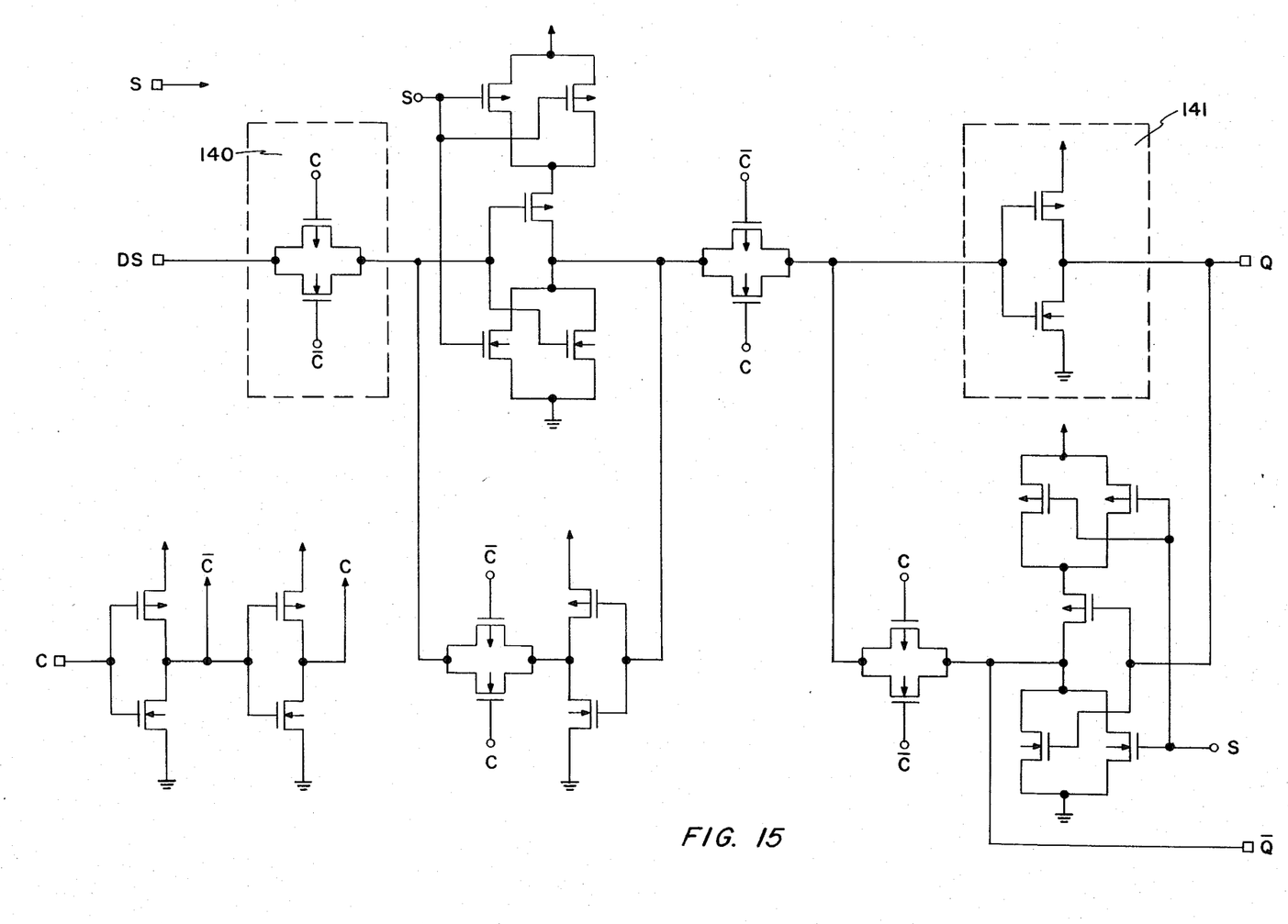
FIG. 15 is a circuit diagram showing a D-type flip-flop constructed by making use of the cells shown in FIG. 4.
Figure 16:
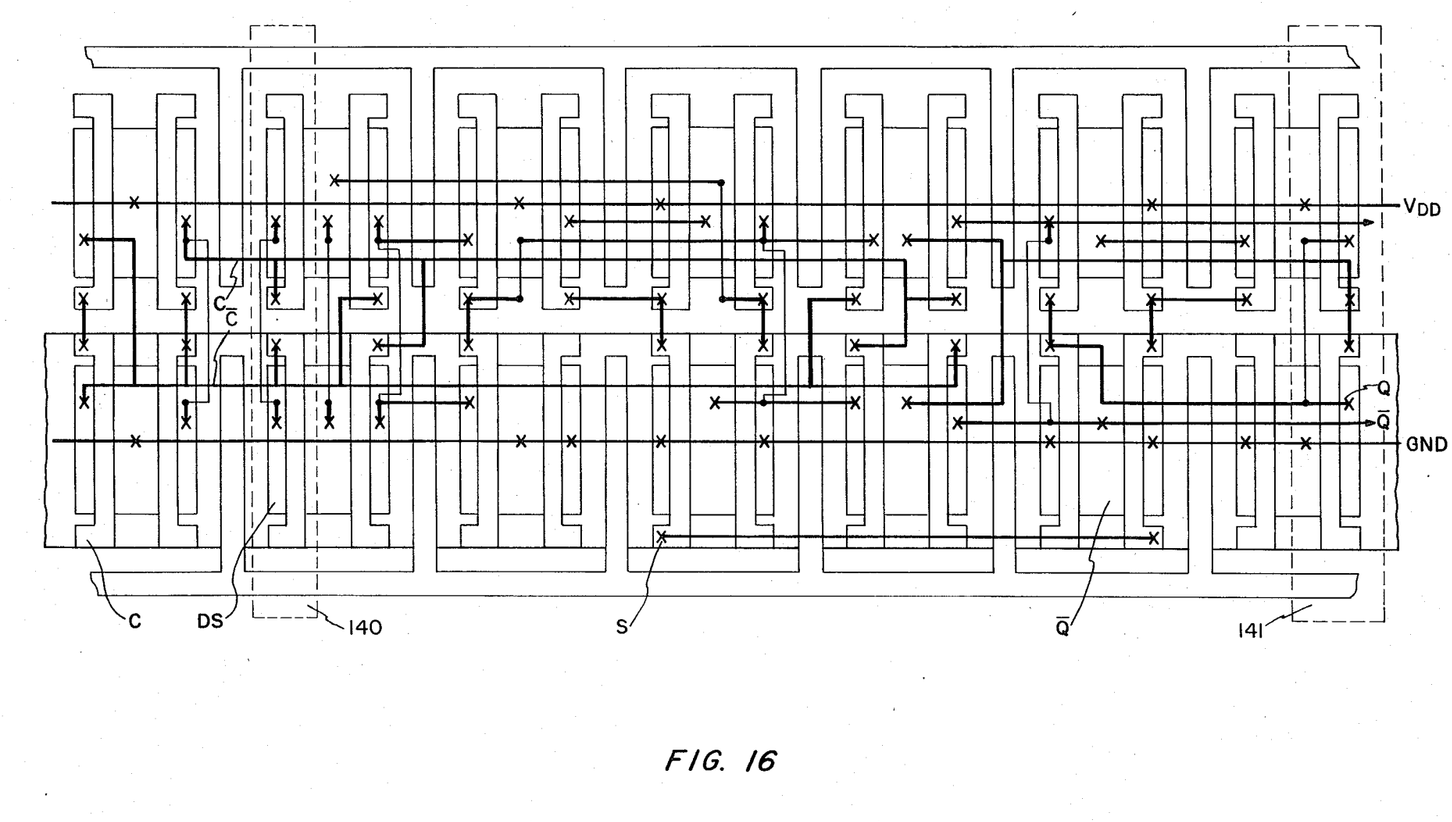
FIG. 16 is a plan view showing an integrated circuit structure of the same D-type flip-flop.

In addition, a logic symbol representing a D-type flip-flop is shown in FIG. 14, and a circuit diagram of a flip-flop consisting of complementary MIS semiconductor devices is shown in FIG. 15. In addition, a layout diagram of such a flip-flop constructed of logic unit cells according to the present invention is illustrated in FIG. 16. In FIG. 16, thick solid lines represent wirings in the first layer, while thin solid lines represent wirings in the second layer, while marks X represent the points where the corresponding wirings made ohmic contact with impurity doped regions in the semiconductor substrate through contact holes in the insulator layer or layers, while marks represent the junction points where the corresponding first layer wiring connects with second layer wirings via through-holes in the interlayer insulater. In this construction of a D-type flip-flop also, similarly to the above-described NAND-circuit, the outputs Q and of the flip-flop can be led out to the longitudinal wiring regions on the both sides of the column of the logic unit cells. Here, a transfer circuit 140 and an inverter circuit 141 of FIG. 15 are exemplarily indicated in FIG. 6 with the same reference numbers.

In a flip-flop and a NAND-circuit can be formed by making use of simple logic unit cell or a plurality of logic unit cells according to the present invention as described above, then most of logic circuit constructions can be realized by combining there flip-flops and NAND-circuits, and this proves that the logic unit cells proposed according to the present invention are excellent in that they well fulfil the performance required for basic cells in a master-slice system.

Moreover, if the method for arraying logic unit cells according to the present invention is employed, a semiconductor substrate chip can be effectively filled with function circuits with minimum gap spaces retained between the logic unit cells to such extent that can admit wirings. In other words, as compared to the large scale integrated circuits of the master-slice system in the prior art, a semiconductor chip area can be used more effectively, and a degree of integration of large scale integrated circuits can be further improved.

Another semiconductor structure of the logic unit cell will be described with reference to FIG. 17.

In the previous embodiment of FIG. 5, gate electrodes for the transistors are made of polycrystalline silicon. However, a sheet resistance of polycrystalline silicon is relatively large and hence a relatively large time constant is inevitably introduced into the gate electrode wirings. Therefore, such a structure employing polycrystalline silicon is insufficient for a high-speed operation. This embodiment overcomes this disadvantage.

Figure 17:
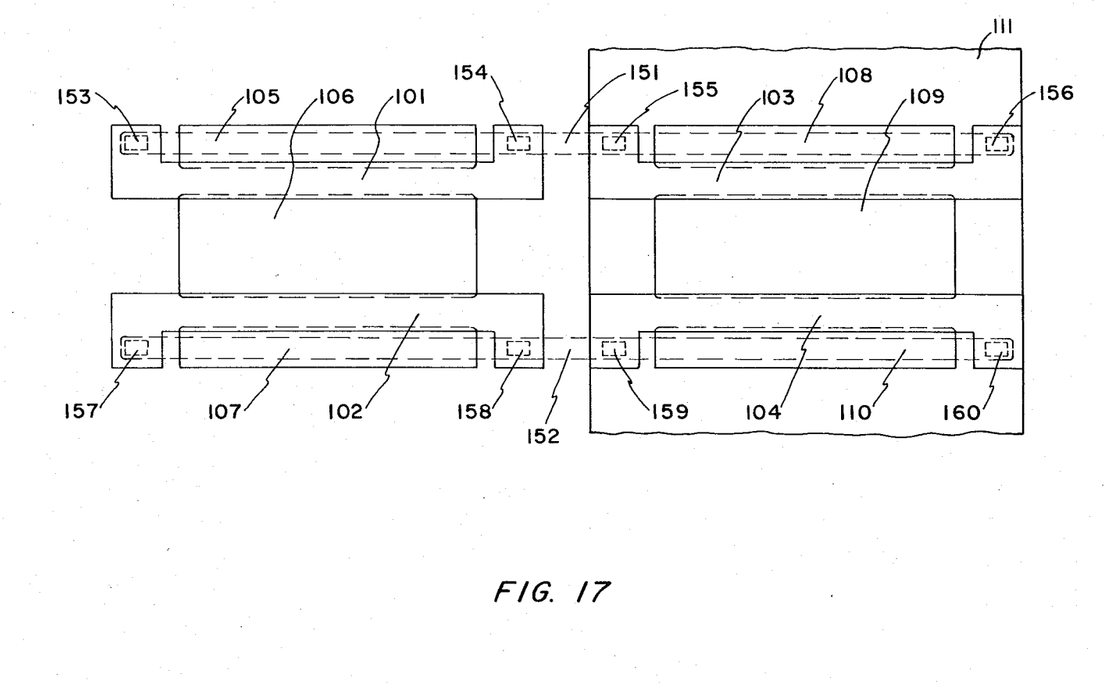
FIG. 17 is a plan view showing another structure of the logic unit cell.

As shown in FIG. 17, highly conductive metal wirings 151 and 152 are formed in the lateral direction and in parallel with the gate electrodes 101 and 103, and 102 and 104 respectively. The wiring 151 are electrically connected to both ends of the gate electrode 101 through contact hole 153 and 154, and connected to both ends of the gate electrode 103 through the contact holes 155 and 156 formed in an insulator. Thus, low resistance electrical path due to the wiring 151 is superposed on the gate electrodes 101 and 102. Similarly, row-resistance electrical path due to the wiring 152 is superposed on the gate electrodes 102 and 104. Thus, effective resistance of the gate electrodes made of the polycrystalline silicon is remarkably reduced. In this embodiment, though electrically common wiring is used for both the gate electrodes 101 and 102, it is also possible to apply electrically separate wiring to the individual gate electrodes in the case that the gate electrodes 101 and 102 are electrically made independent.

Figure 18:
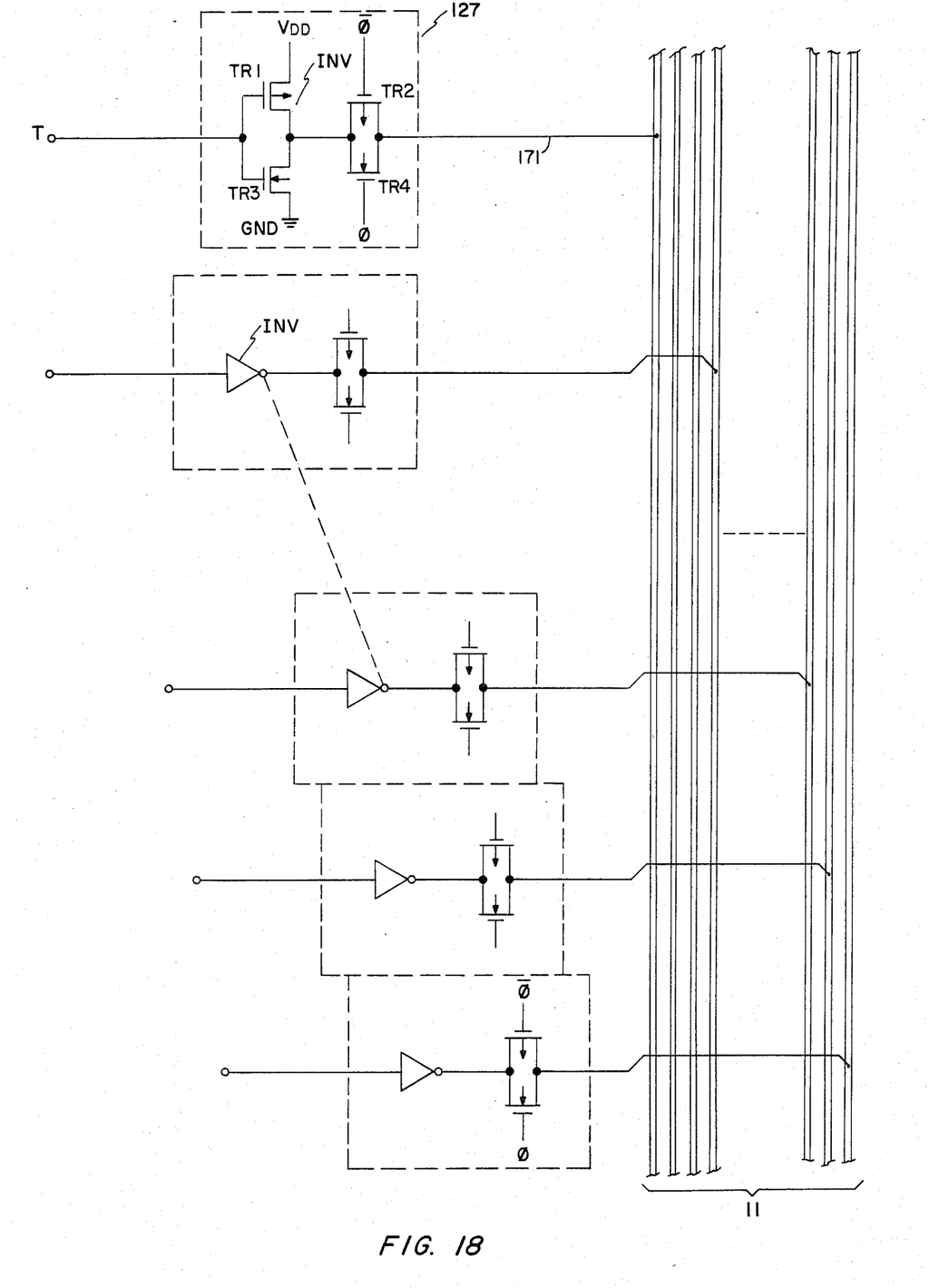
FIG. 18 is a circuit diagram showing another application of the logic unit cells according to the present invention.

Now with reference to FIG. 18, another application of the logic unit cells according to the present invention will be described.

In this application, the logic unit cells 127 are used to form interface circuits coupled to the data bus lines 11 (FIG. 1). In each of the logic unit cells 127, the P-channel transistor TR1 and the N-channel transistor TR3 are connected in series so as to form an inverter INV while the P-channel transistor TR2 and the N-channel transistor TR4 are connected in parallel so as to form a transfer gate. An input terminal of the inverter is connected to a pad T formed on a peripheral portion of a semiconductor chip. The transfer gate is coupled between an output terminal of the inverter and the data bus line through a wiring 171. A true and a complementary control signals $\phi$ and are applied to the gates of the transistors TR4 and TR2, respectively. According to this embodiment, a large capacity of interface function or multiplex function can be realized by employing the logic unit cells 127.

Now description will be made on the patterning of wirings according to the present invention. As described previously, it is a characteristic advantage of the present invention that a large variety and small amount of LSI's can be developed within a short period by designing only metallic wirings relating to the unit cells on a semiconductor substrate in which basic elements such as transistors, resistors and the like have been already designed. The patterning of the wirings related to the unit cells on a semiconductor substrate in which basic elements such as transistors, resistors and the like have been already designed. The patterning of the wrings related to the unit logic cells is effected through a direct exposure process by making use of an electron beam picturing appartus. This direct exposure process of electron beam has a shortcoming that an amount of processing per unit time of an electron beam exposure apparatus is less than that of an optical exposure apparatus. In addition, an electron beam exposure apparatus also has another shortcoming that a resist film on a semiconductor wafer would be partly sputtered by bombardment of an electron beam and partly deposited on the inner surface of the electron beam picturing apparatus, resulting in charging of the inner surface, and thereby a precision of picturing is lowered. Accordingly, it is desirable to avoid unnecessary exposure of in an electron beam exposure apparatus. Furthermore, since an electron beam exposure apparatus is a vacuum instrument and it takes much time and expense for cleaning contamination on its inner surface caused by resist material, in order to minimize the labor for maintenance also, unnecessary picturing should be avoided as much as possible.

A pattern of metallic wirings in the integrated circuit according to the present invention is divided into a wiring pattern portion that is used in common to every variety of LSI's such as power supply wiring $V_{DD}$ and GND, and the other wiring pattern portion that is different for each variety of LSI's such as logic unit cell portions and a ROM portion in a microcomputer. Therefore, for the integrated circuit according to the present invention, the wiring pattern portion that is used in common to every variety of LSI's is exposured with an optical exposure apparatus employing a photomask, whereas with respect to the wiring pattern portion that is different for each variety of LSI's, direct exposure is effected by making use of an electron beam picturing apparatus.

In the following, a patterning process for metallic wirings will be explained with reference to FIG. 19 which shows one preferred embodiment of the process in a flow chart.

Figure 19:
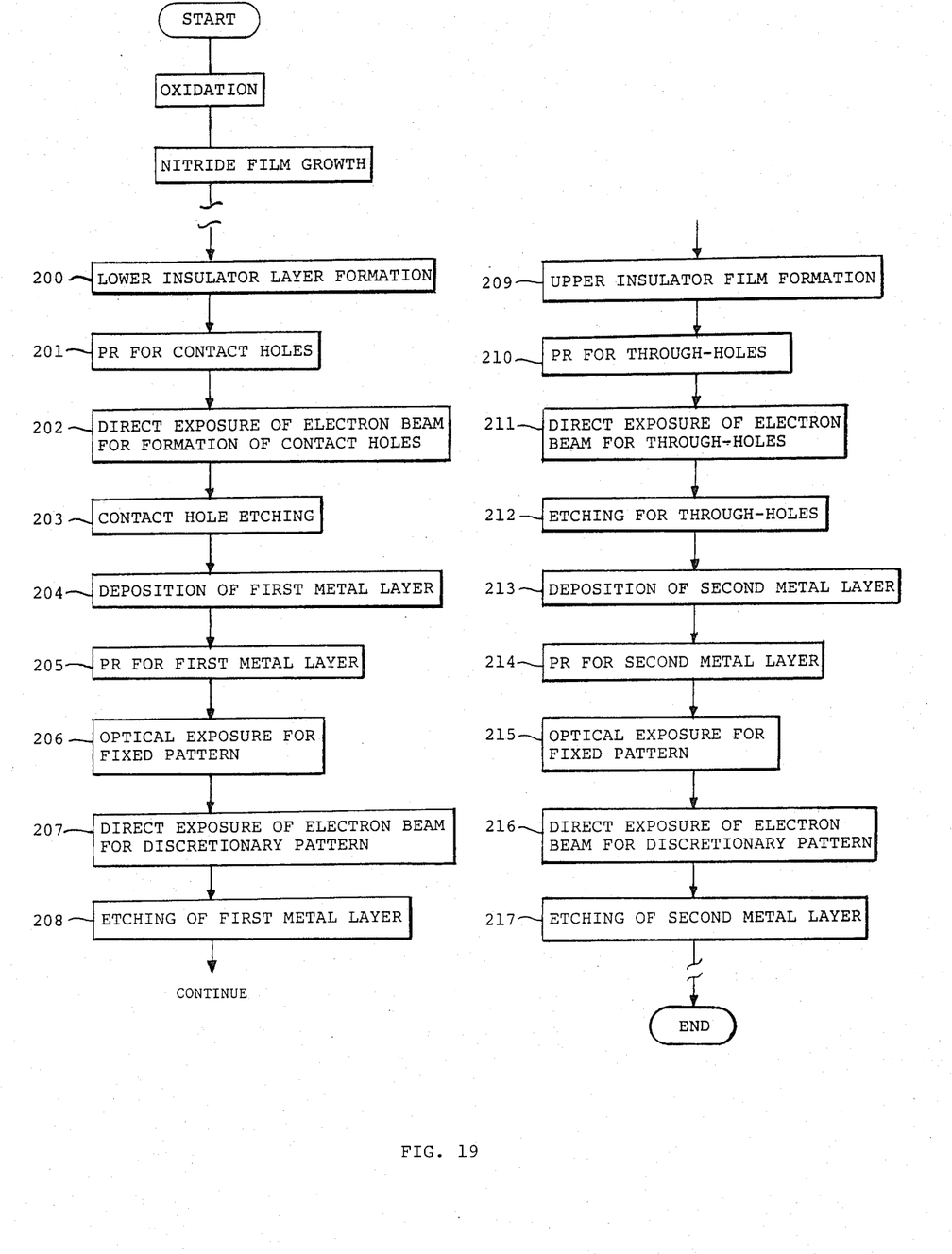
FIG. 19 is a flow chart to be used for explaining the process for forming a wiring pattern according to the present invention.

FIG. 19 shows a flow chart of a wiring forming process which constitutes a part of the process for manufacturing IC's according to the present invention. In this case, the wiring is formed of a conductive metal such as aluminum. In this flow chart, the sub-process for forming a first layer metallic wiring pattern includes the steps of lower insulator layer formation 200 to first layer metallic wiring film etching 208. The sub-process for forming a second layer metallic wiring pattern includes the steps of upper insulator layer formation 209 to second layer metallic wiring film etching 218. In these sub-processes, each of the pattern exposures for the first layer metallic wirings and the second layer metallic wirings is achieved by first effecting optical masking exposure 206 or 215 for the common pattern portion of the metallic wiring pattern, after the step of applying photo-resist (PR) 205 or 214, and subsequently effecting direct picturing with an electron beam 207 or 216 for the pattern portion that is different for each variety of IC's.

As is made clear from FIG. 19, a fixed wiring pattern is made by the optical pattern exposure on a photo-resist which can be made in a short-time and with a low cost and a variable wiring pattern associated to the logic unit 1 cells is done by the direct exposure of electron beam which has large flexibility in modifying pattern.

I claim:

1. An integrated semiconductor circuit comprising a semiconductor substrate having first to fourth edges; a first surface area including a first portion extending along said first edge of said substrate, a second portion extending along said second edge of said substrate, and a third portion extending along said third edge of said substrate; a second surface area having at least first, second and third sides respectively making contact with said first, second and third portions of said first surface area; said first portion of said first surface area lying between said first edge of said substrate and said first side of said second surface area, said second portion of said first surface area lying between said second edge of said substrate and said second side of said second surface area, said third portion of said first surface area lying between said third edge of said substrate and said third side of said second surface area; a computer function block formed on said second surface area of said substrate, said computer function block including in a fixed positional relationship a read only memory on said second surface area, a random access memory on said second surface area, an arithmetic logic unit on said second surface area, a peripheral input/output circuit on said second surface area, a first bus running adjacent to and along said first side of said second surface area, and a second bus running adjacent to and along said third side of said second surface area; each of said random access memory, said arithmetic logic unit and said peripheral input/output circuit having a plurality of wirings arranged in fixed patterns; a first group of logic unit cells formed on said first portion of said first surface area; a second group of logic unit cells formed on said second portion of said first surface area; a third group of logic unit cells formed on said third portion of said first surface area; first discretionary wirings having arbitrary patterns for arbitrarily interconnecting selected ones of said first, second and third groups of logic unit cells to performed arbitrary logic functions; second discretionary wirings having arbitrary patterns for connecting the selected logic unit cells in said first group of logic unit cells to said first bus of said computer function block; and third discretionary wirings having arbitrary patterns for connecting the selected logic unit cells in said third group of logic unit cells to said second bus of said computer function block; whereby said selected logic unit cells form an additional peripheral circuit or an expanded interface circuit for said computer function block.

2. The circuit according to claim 1, in which each of said logic unit cells includes first and second P channel field effect transistors, and first and second N channel field effect transistors.

3. The circuit according to claim 1, further comprising a plurality of electrode pads formed on said first surface area of said semiconductor substrate and adjacently to said first, second and third edges and a third wiring connected between a selected pad and a selected logic unit cell.

4. An integrated semiconductor circuit comprising a semiconductor substrate; a memory circuit fabricated on a portion of a surface of said semiconductor substrate; said portion of the surface of said semiconductor substrate having at least three sides; a plurality of logic unit cells fabricated on said semiconductor substrate along said three sides of said portion and arrayed in a matrix of rows and columns, each of said logic unit cells including at least first to sixth internal terminals, first and second field effect transistors of a first conductivity type, third and fourth field effect transistors of a second conductivity type, each of said transistors having a gate, a source, and a drain, one of the drain and source of said first transistor being connected to said first internal terminal; one of the drain and source of said second transistor being connected to said second internal terminal, the others of the drains and sources of said first and second transistors being connected in common to said third internal terminal, one of the drain and source of said third transistor being connected to said fourth internal terminal, one of the drain and a source of said fourth transistor being connected in common to said fifth internal terminal, the others of the drains and sources of said third and fourth transistors being connected in common to said sixth internal terminal, and a first wiring for selectively connecting said internal terminals and at least some gates of said first to fourth transistors within the same logic cell; said first and second transistors of the logic unit cells being arranged in identical columns and disposed in line, said third and fourth transistors of the logic unit cells being arranged in other identical columns and disposed in line, said first and third transistors of the logic unit cells being arranged in identical rows and disposed in lines, said second and fourth transistors of the logic unit cells being arranged in other identical rows and disposed in lines; a second wiring for selectively connecting said logic unit cells; and a third wiring for selectively connecting said memory circuit and said logic unit cells.

* * * * *